United States Patent [19]

Mito

[11] Patent Number: 4,618,959
[45] Date of Patent: Oct. 21, 1986

[54] DOUBLE HETEROSTRUCTURE SEMICONDUCTOR LASER WITH PERIODIC STRUCTURE FORMED IN GUIDE LAYER

[75] Inventor: Ikuo Mito, Tokyo, Japan

[73] Assignee: NEC Corporation, Tokyo, Japan

[21] Appl. No.: 541,211

[22] Filed: Oct. 12, 1983

[30] Foreign Application Priority Data

Oct. 12, 1982 [JP] Japan .............................. 57-178824
Mar. 16, 1983 [JP] Japan ................................ 58-43477
Apr. 5, 1983 [JP] Japan ................................ 58-59505

[51] Int. Cl.[4] ............................................. H01S 3/19
[52] U.S. Cl. ...................................... 372/46; 372/48; 372/50; 372/96
[58] Field of Search ....................... 372/44, 45, 46, 48, 372/50, 96; 357/17

[56] References Cited

U.S. PATENT DOCUMENTS 4,464,762 8/1984 Furuya ................................... 372/50

OTHER PUBLICATIONS

Abe et al., "GaInAsP/InP Integrated Laser with Butt-Jointed Built-In Distributed-Bragg-Reflection Waveguide", *Electronics Letters*, Dec. 10, 1981, vol. 17, No. 25, pp. 945–947.

*Primary Examiner*—James W. Davie
*Attorney, Agent, or Firm*—Sughrue, Mion, Zinn, Macpeak, and Seas

[57] ABSTRACT

A single longitudinal mode semiconductor laser is fabricated as a composite structure using the plane orientation dependency of the growth rate to grow epitaxial layers which are separate on both sides of a step having a slant crystal face, thus forming a first level and a second level higher than the first level, the step defining the transition between the first and second levels, which transistion is in the propagation direction of the laser radiation. A first semiconductor layer having a periodic structure and forming a waveguide layer extending over the second level. A second semiconductor layer separated at the step has a first portion extending over the first semiconductor layer and a second portion over the first level. A semiconductor active layer also separated at the step extends over both portions of the second semiconductor layer such that an end of the semiconductor active layer abuts an end of the waveguide layer at the step.

4 Claims, 14 Drawing Figures

FIG. 3
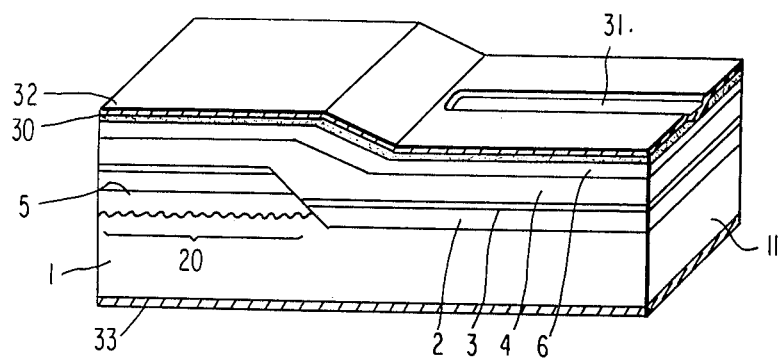
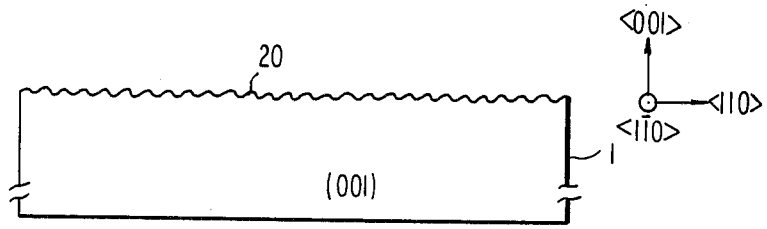
FIG. 4(a)
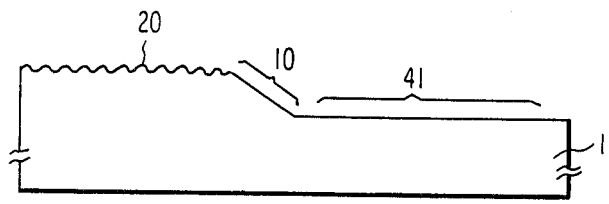
FIG. 4(b)
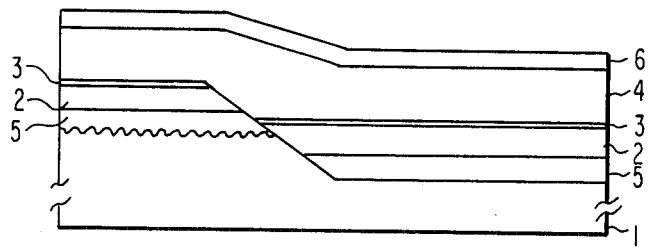
FIG. 4(c)
FIG. 5
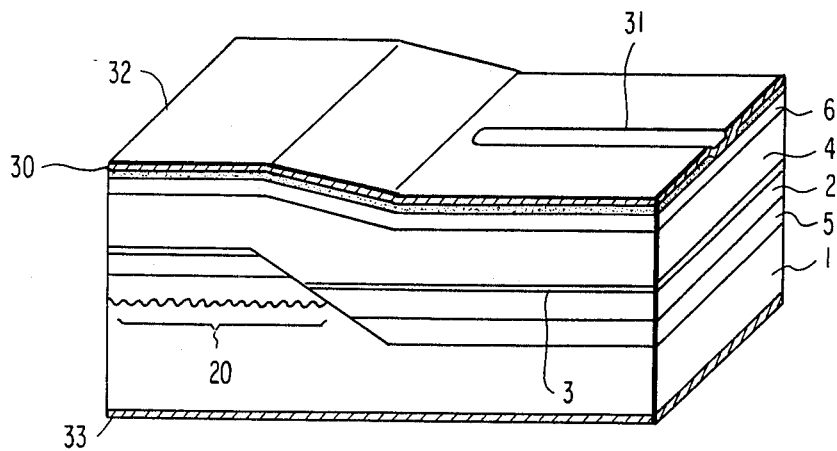

DOUBLE HETEROSTRUCTURE SEMICONDUCTOR LASER WITH PERIODIC STRUCTURE FORMED IN GUIDE LAYER

BACKGROUND OF THE INVENTION

The present invention relates to a single longitudinal mode semiconductor laser which may be used as a light source in optical fiber communication systems.

Optical fiber communication has been rapidly put into practice as the means were developed to effectively reduce signal attenuation in optical fibers and to prolong the life of the semiconductor. Experiments were started to build systems capable of super long distance transmission (more than 100 km) in super-low-loss transmission bands of less than 0.5 dB/km that is attainable in the wavelengths of 1.3 microns and 1.5 microns. Their application to long distance trunk lines in submarine communication systems and the like is being considered, as it is desirable to extend the interval distance between repeaters in such a system.

In such a long distance transmission system, chromatic dispersion becomes another critical issue, in addition to the transmission loss which occurs in optical fibers. Semiconductor lasers are generally utilized as the light source in optical fiber communication systems, but the components of a conventional structure which uses the cleavage facets of a crystal as a Fabry-Perot resonator do not necessarily provide single longitudinal mode oscillation. Especially at the time of high speed modulation, as the number of oscillation mode increases, the interval between repeaters in a high speed communication system (such as 400 Mb/s and 1.6 Gb/s systems) is limited mainly by the chromatic dispersion rather than the transmission loss. In order to realize a long-distance and yet high-speed transmission system, it is therefore desirable to employ a semiconductor laser which is capable of a single longitudinal mode of oscillation even during high speed modulation.

As a semiconductor laser of this type, there have been proposed a distributed Bragg reflector semiconductor laser and a distributed feedback laser which do not use a Fabry-Perot resonator, but have built-in gratings of a periodic structure. Components of several structures have been made on a trial basis and have reached the level where room-temperature CW oscillation is possible. In one of the proposals, the distributed-Bragg-refection waveguide is disposed close to the boundary of the air while the active layer is farther away (Y. Abe et al, "GaInAsP/InP Integrated Laser with Butt-Jointed Built-in Distributed-Bragg-Reflection Waveguide", Electronics Letters, Vol. 17, No. 25, pp. 945-947 Dec. 10, 1981). This would invite some coupling loss between the active layer and the waveguide layer because the field patterns are not in coincidence. The forming of the good distributed-Bragg-reflection waveguide is not easy since the corrugation must be formed in the lower step of the multilayered structure. In another proposal, while the distributed-Bragg-reflector is fully embedded in the semiconductor material, the positional registration between the active layer and waveguide layer is rather difficult, thus effecting the coupling loss (U.S. patent application Ser. No. 447,553, filed Dec. 7, 1982). These structures are not always practically satisfactory in respect of oscillation threshold, and basic performance such as optical output, reliability, reproducability in manufacture, etc. A need has been keenly felt to develop a novel structure using an improved epitaxial growth process and high quality grown crystal.

SUMMARY OF THE INVENTION

The present invention offers a single axial mode semiconductor laser which is superior in fundamental performance and has higher productivity, reliability, and yield, etc.

According to the present invention, a double heterostructure semiconductor laser device comprises; a composite structure including a semiconductor substrate of one conductivity type and a first semiconductor layer disposed on said semiconductor substrate, said composite structure having a first level and a second level higher than said first level to an extent at least the thickness of said first semiconductor layer, the transition between said first and second levels being in the propagation direction of the laser radiation and having a slant crystal face, and said first semiconductor layer on said second level having a periodic structure of a prescribed pitch of thickness formed along the side thereof in the propagation direction of the laser radiation; a second semiconductor layer of one conductivity type, formed on said first and second levels, having a greater bandgap than that of said first semiconductor layer, said second semiconductor layer being separated into two portions at the extension of said slant crystal face; a semiconductor active layer, formed on said second semiconductor layer, having a smaller bandgap than that of said second semiconductor layer, the ends of said semiconductor active layer and first semiconductor layer abutting together at the extension of said slant crystal face; and a third semiconductor layer of the opposite conductivity type, formed on said semiconductor active layer, and having a greater bandgap than that of said semiconductor active layer, whereby the application of a forward bias to said semiconductor active layer produces stimulated emission of radiation.

BRIEF DESCRIPTION OF THE DRAWINGS

Other advantages and features of the present invention can be more readily understood from the more detailed description hereunder taken in conjunction with the accompanying drawings, wherein:

FIGS. 2(a) and 2(b) are perspective views of a single axial mode semiconductor laser of this invention wherein FIG. 2(a) is a perspective view of an intermediate stage of the manufacturing process and FIG. 2(b) is a perspective view of a completed product;

FIG. 3 is a perspective view of the second embodiment according to the present invention;

FIGS. 4(a), 4(b) and 4(c) are cross sectional views of the third embodiment according to this invention wherein they respectively show cross sections at different stages of the process;

FIG. 5 is a perspective view to show the structure of the third embodiment according to this invention;

FIGS. 8(a), 8(b) and 8(c) are perspective views of the sixth embodiment according to this invention wherein, FIGS. 8(a) and 8(b) show in perspective different stage of the manufacturing process and FIG. 8(c) a completed stage.

DESCRIPTION OF THE PREFERRED EMBODIMENTS

Figure 1A:
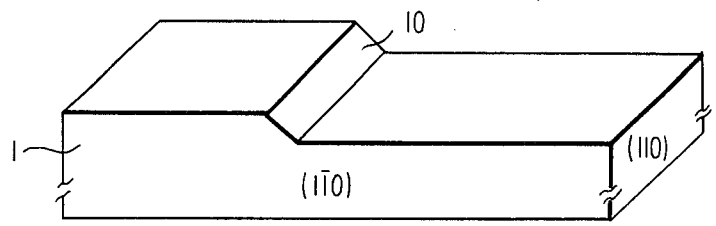
FIGS. 1(a) and 1(b) are perspective views to explain a principle of the epitaxial growth process used in the embodiments according to the present invention.
Figure 1B:
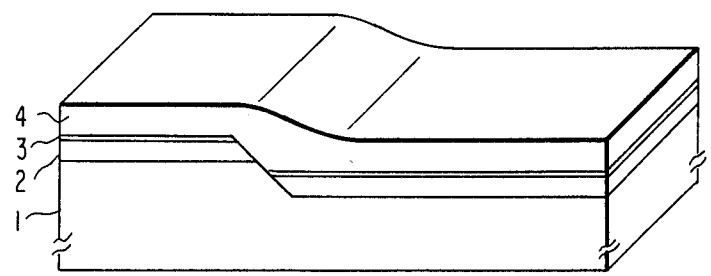

Before entering into the explanation of embodiments, description will be given of the epitaxial growth process which enables this invention. Reference will be made to FIGS. 1(a) and 1(b). FIG. 1(a) shows a terrace substrate which is obtained by etching an n-InP substrate 1 of (001) plane to form a difference of 0.9 micron between both sides of a step extending parallel to the direction $<1\bar{1}0>$. The plane (111) is exposed on the sloped plane of the step 10. When an n-InP buffer layer 2 of 0.5 micron thickness and an InGaAsP active layer 3 of 0.2 micron are grown by the liquid-phase epitaxial process on this terrace substrate using a solution having a relatively small supersaturation (for example, typically $\Delta T = 2°$ C.), the layers are separately grown onto both sides of the step portion 10. This is because the growth rate on the (111) plane is slower than that on the (001) plane. When a p-InP cladding layer 4 is grown to a 1.0 micron thickness using a solution of a relatively large supersaturation (for example, typically $\Delta T = 10°$ C.), it does not separate at the step 10, but covers the whole surface. (Such properties of epitaxial growth are, for example, described in Japanese Patent Laid-Open Publication Sho. 57-12580.).

As described above, by using the plane orientation dependency of the growth rate, it is possible to grow epitaxial layers which are separated on both sides of the step portion 10. In FIG. 1(a) the step 10 is described as the (111) plane, but it may be another plane such as (113).

Figure 2A:
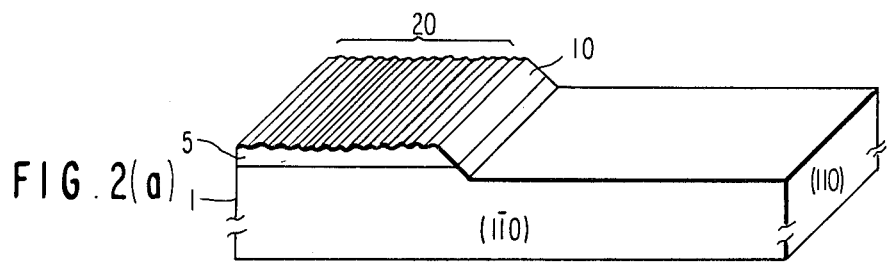
Figure 2B:
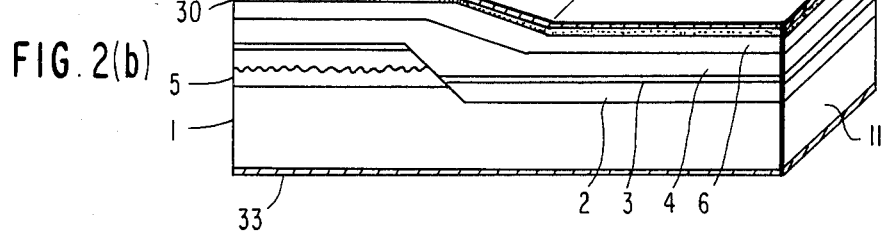

FIGS. 2(a) and 2(b) are perspective views to show the first embodiment according to this invention. As shown in FIG. 2(a), on an n-InP substrate 1 of (001) plane orientation is grown an InGaAsP waveguide layer 5 of 0.5 micron thickness (non-doped, bandgap equivalent to 1.3 microns in the wavelength of emitted light). A periodic structure 20 that consists of a great number of grooves in parallel to the direction $<1\bar{1}0>$ with a period of about 2200 Å in the direction $<110>$ is formed on the upper surface, and then the portion which is parallel to the direction $<1\bar{1}0>$ and on the right side to the step portion 10 is etched, by conventional photolithographic technique, with Br-methanol etching solution to a depth of 0.9 micron to form a terrace substrate. On the step portion 10 is exposed the (111) plane. As shown in FIG. 2(b) on the terrace substrate are grown an n-InP buffer layer 2 (film thickness of 0.5 micron, bandgap equivalent to wavelength 0.94 micron, Sn-doped, $1 \times 10^{18}/cm^3$) and a non-doped InGaAsP active layer 3 (bandgap equivalent to 1.55 microns in emitted light wavelength; thickness 0.2 micron) each of which layers is discontinuous at the the step portion 10. Then, a p-InP cladding layer 4 (thickness 1.0 micron, Zn-doped, $1 \times 10^{18}/cm^3$) and a p-InGaAsP cap layer 6 (bandgap equivalent to 1.2 microns in emitted light wavelength, 0.7 micron thickness, Zn-doped, $1 \times 10^{19}/cm^3$) are deposited continuously over the whole plane. The epitaxial growth of the buffer, active, and cladding layers is performed as described with reference to FIG. 1. Subsequently, an SiO$_2$ insulating film 30 is formed upon the p-InGaAsP cap layer 6 by the CVD technique. The SiO$_2$ insulation film 30 is removed from a current injection region 31 of 10 micron width and 250 micron length which is parallel to $<110>$ in the form of stripes and an Au-Zn metal electrode 32 is formed on the film 30. On the underside of substrate 1 is formed an Au-Ge-Ni metal electrode 33. A mirror reflection plane 11 is formed by cleavage on a side while the other side is cleft so as to have 500 microns in the length of an InGaAsP waveguide layer 5 which is a distributed Bragg reflection region. Such a length is sufficient for almost all the incident light from the InGaAsP active layer 3 into the InGaAsP waveguide layer 5 to be distributively reflected by the periodic structure 20 formed upon the upper surface of the InGaAsP waveguide layer 5 and to be returned back to the InGaAsP active layer 3.

The first embodiment of a single longitudinal mode semiconductor laser just described is characterized by the followings: the longitudinal mode of oscillation was achieved at a Bragg frequency which was determined by a period of the periodic structure 20 and was in the single mode at the wavelength of 1.55 micron. The InGaAsP active layer 3 and the InGaAsP waveguide layer 5 were optically connected in a butt-joint configuration at the optical coupling efficiency of 90 percent; that is, the loss at the connection is small. As the InGaAsP waveguide layer 5 was non-doped, the loss by free-carrier absorption is also small. Therefore, the loss of the light which enters from the InGaAsP active layer 3 into the InGaAsP waveguide layer 5 and is distributively reflected and returned to the InGaAsP active layer 3 is small, thereby limiting the oscillation threshold to a value within the range of 250 mA. Compared to the prior art single axial mode semiconductor laser of the distributed Bragg reflector type which forms the periodic structure in a process after the epitaxial growth, it was readily manufactured because the periodic structure 20 can be formed over the whole flat surface of an InGaAsP waveguide layer 5. The light emitting region is easily manufactured with a higher reproducibility because of a simple double-hetero-junction structure. It has high reliability as the technique for establishing the double-hetero-junction has long been established. The connection between the InGaAsP active layer 3 and the InGaAsP waveguide layer 5 is relatively complex in the structure, but there will be no deterioration as no current is injected thereto.

As described above, the first embodiment of the single longitudinal mode semiconductor laser according to this invention has superior oscillation characteristics, is simple to manufacture and is as high in reliability as that of a simple double-hetero-junction structure.

FIG. 3 shows perspectively the second embodiment of the present invention. This embodiment is different from the first one in that a periodic structure 20 is first formed upon an InP substrate 1 per se, second an InGaAsP waveguide layer 5 is formed thereupon, and then the right side is etched to reach the substrate using a Br-methanol solution. Otherwise, the structure and manufacturing process of the second embodiment are substantially similar to that of the first embodiment. The structure of the second embodiment provides superior oscillation characteristics, excellent yield in production and high reliability similar to the first embodiment.

FIGS. 4(a), 4(b) and 4(c) shows the manufacturing process of the third embodiment of this invention. As shown in FIG. 4(a), a periodic structure 20 having a period of about 2200 Å and a depth of about 0.1 micron is formed by the interference exposure process using He-Cd laser and the photo-lighography process in a manner to make the pitch direction thereof parallel to the <110> direction. It is then etched in the direction parallel to the <1$\bar{1}$0> direction or the direction vertical to the above with a (3HCl+1H$_3$PO$_4$) solution to obtain the shape shown to FIG. 4(b). The plane 41 which is etched in the depth of about 1.2 microns from the boundary of the step portion 10 achieves a complete specular surface without a trace of periodic structure because its depth is very shallow. Then epitaxial growth takes place thereupon by the conventional liquid phase epitaxial growth process using a carbon slide boat. FIG. 4(c) shows the multi-layer structure after the growth. An n-InGaAsP waveguide layer 5, (thickness 0.5 micron, bandgap equivalent to emitted light wavelength of 0.3 microns, Sn-doped, 3×10$^{17}$/cm$^3$), an n-InP buffer layer 2 (Sn-doped, 1×10$^{18}$/cm$^3$, thickness 1 micron) and a non-doped InGaAsP active layer 3 (thickness 0.1 micron, bandgap equivalent to 1.55 microns in oscillation wavelength) are grown in discontinuation on both sides of the step portion 10.

Then, a p-InP cladding layer 4 (thickness 2 microns, Zn-doped, 1×10$^{18}$/cm$^3$) and a p-InGaAsP cap layer 6 (thickness 0.7 micron, bandgap equivalent to emitted light wavelength of 1.2 microns, Zn-doped, 1×10$^{18}$/cm$^3$) are grown from a solution of a large supersaturation to cover the whole surface. The positions of the waveguide layer 5, the buffer layer 2 and the active layer 3 are different in height between both sides of the step portion 10. Using the etched plane 41 as a reference, the waveguide layer 5 disposed on the periodic structure 20 is positioned at the height of 1.2–1.7 microns from the plane 41. On the other hand, the active layer 3 on the etched plane 11 is positioned at the height 1.5 to 1.6 microns therefrom. Both layers, therefore, are connected in a butt-joint configuration. Even if the thickness of an epitaxially grown film fluctuates in respective layers by about 10 percent, as the thickness of the waveguide layer 5 is as large as 0.5 micron, the ends of the active layer 3 and of optical guide layer 5 do not come completely out of positional registration. This can achieve excellent reproducibility.

Then, the semiconductor wafer thus formed is provided with electrodes, cleft in parallel to <1$\bar{1}$0>, and formed with a resonator plane to form a chip as shown in FIG. 5. The characteristics of this component are, when the lengths of the active layer 3 and waveguide layer 5 are 200 microns and 500 microns, respectively, an oscillation threshold about 250 mA at room temperature, a differential quantum efficiency about 15 percent on one side, and the oscillation wavelength 1.55 microns in a single longitudinal mode.

As described above, the third embodiment of a single longitudinal mode semiconductor laser according to the present invention shown in FIG. 5 can be grown by one step epitaxial growth, thereby providing advantages in productivity.

Figure 6:
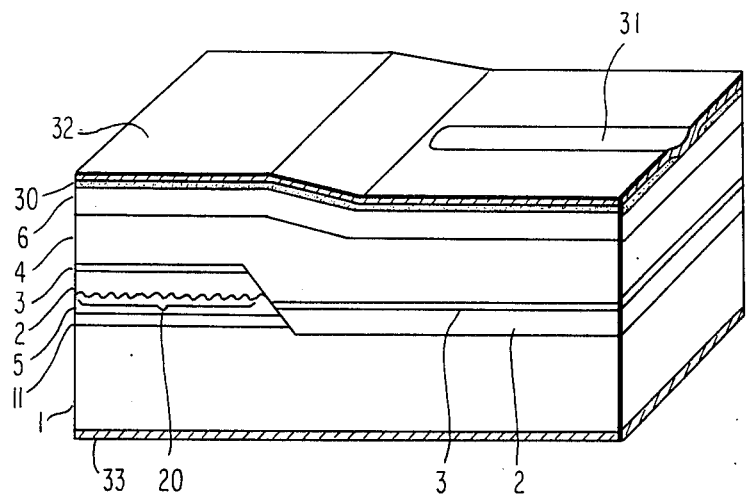
FIG. 6 is a perspective view to show the structure of the fourth embodiment of this invention.

The fourth embodiment according to this invention will now be described referring to the perspective view in FIG. 6. This embodiment is an improvement of the first embodiment shown in FIG. 2(b). More particularly, the injection current is limited to the striped region in the first embodiment, but there exists a leakage current which flows transversely across the p-InP cladding layer 4 and into the active layer 3 formed on the periodic structure 20. In order to reduce the leakage current, the fourth embodiment is provided with a p-InP leak current block layer 11 (Zn-doped, thickness 0.3 micron) between the optical waveguide layer 5 and an n-InP substrate 1. In this structure, after the growth of the blocking layer and waveguide layer, a periodic structure is produced and then the right side of a multilayer substrate is etched to reach the substrate. With such an arrangement, the multi-layer structure of the region where a periodic structure 20 is formed becomes a pnpn junction. At the normal mode of operation the voltage is at or less than the voltage which turns on the pnpn junction (about 10 v), and therefore almost no current flows, and the leakage current is thus reduced. The oscillation threshold therefore was lowered to 200 mA.

Figure 7:
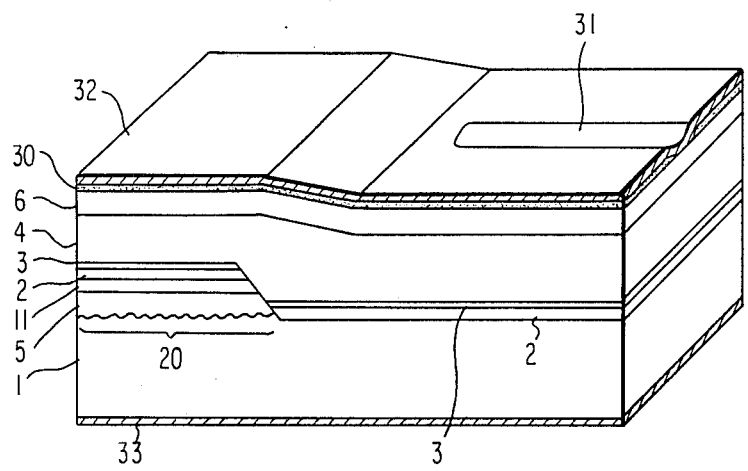
FIG. 7 is a perspective view of the fifth embodiment according to this invention.

The fifth embodiment according to the present invention will now be explained referring to the perspective view shown in FIG. 7. This embodiment is an improvement of the second embodiment shown in FIG. 3 wherein a p-InP leak current blocking layer 11 is provided on an optical waveguide layer 5 so as to reduce the leakage current. As the multi-layer structure of the region where a periodic structure 20 is formed is a pnpn junction in a similar manner to the fourth embodiment shown in FIG. 6, the leakage current can be reduced.

As shown by the fourth and the fifth embodiments in the foregoing, the leakage current can be reduced to improve component characteristics by making the multilayer structure of the region where a periodic structure 20 is formed as a pnpn junction. This structure may be applicable to other single longitudinal mode semiconductor lasers such as in the third embodiment shown in FIG. 5.

There is no optical confinement in the transverse direction or the direction of the junction plane in the single longitudinal mode semiconductor lasers mentioned above. The oscillation characteristics therefore may be further improved by providing a waveguiding configuration in the transverse direction, too.

Figure 8A:
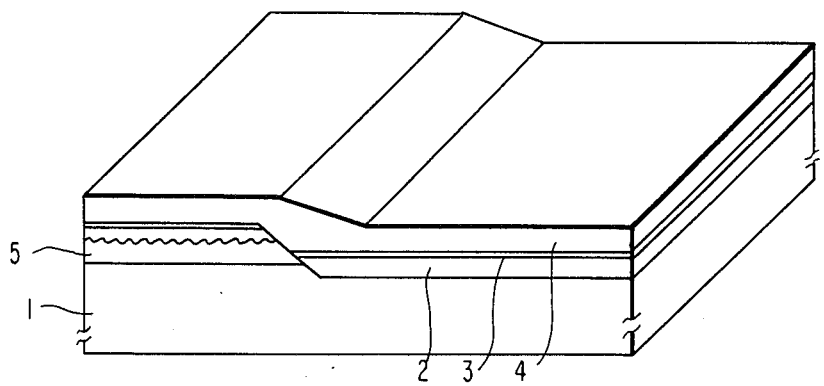
Figure 8B:
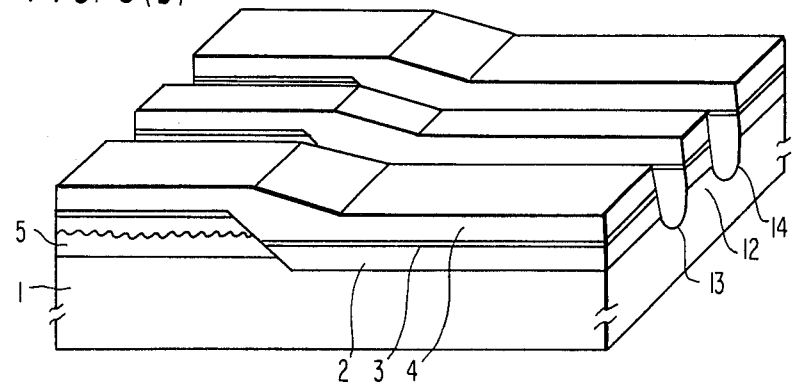
Figure 8C:
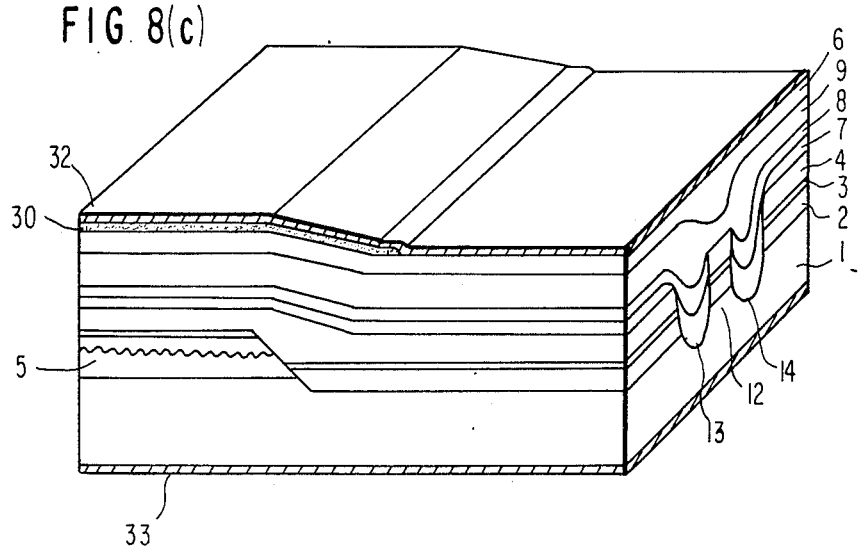

In FIGS. 8(a), 8(b) and 8(c), the sixth embodiment according to this invention is a single longitudinal mode semiconductor laser having improved optical confinement in the transverse direction in the InGaAsP active layer 3 and a InGaAsP waveguide layer 5 by means of the buried-type structure.

Such a single axial mode semiconductor laser is manufactured as shown in FIG. 8(a) by the process of forming a multi-layered film substrate, the layer structure being substantially similar to the first embodiment shown in FIG. 2(b). The difference lies in that the p-InGaAsP cap layer in FIG. 2(b) is not grown. As shown in FIG. 8(b), the substrate is formed with two parallel grooves 13, 14 of about 5 micron width and of about 3 micron depth so as to form a mesa stripe 12 of about 2 micron width therebetween. As the InGaAsP active layer 3 and the InGaAsP waveguide layer 5 are included within the central mesa stripe 12, the optical waveguide assumes a rectangular shape. As shown in FIG. 8(c), the substrate is embedded using the liquid phase epitaxial growth process with a p-InP current blocking layer 7 (Zn-doped, film thickness at the flat portion 0.5 micron), an n-InP current confinement layer 8 (Te-doped, film thickness at the flat portion 0.5 micron), a p-InP embedding layer 9 (Zn-doped, film thickness 1.5 microns) and a p-InGaAsP cap layer 6 (Zn-doped, film thickness at the flat portion 1.0 micron). Using a solution of relatively small supersaturation (typically ΔT=2° C.) allows the first two layers to grow from the shoulder portion of the mesa stripe 12 in the lateral direction and not to grow on the upper portion thereof. This multilayer embedded substrate is formed with SiO$_2$ insulating film 30 in a manner to extend from the upper portion of the connection between the In-GaAsP active layer 3 and the InGaAsP waveguide portion 5 to the upper portion of the InGaAsP waveguide layer 5. Further, Au-Zn electrode 32 is provided on the layer 6 while Au-Ge-Ni electrode 33 is provided on the underside of the substrate. The laser resonator length is set as in the first embodiment. When a bias voltage is applied, with the p-side metal electrode 32 as positive and the n-side metal electrode as negative, the InGaAsP active layer 3 in the mesa stripe 12 receives a forward bias across a pn junction and a current is injected to cause radiative recombination, thereby achieving laser oscillation.

As the regions other than the mesa stripe exhibit a pnpn junction, no current flows unless a voltage of 10 V or more which can turn on the pnpn junction is applied. Therefore, at a voltage usually applied or 2-3 V specified under the normal operational mode, the current becomes concentrated within the mesa stripe 12. The light emitted from the InGaAsP active layer 3 within the mesa stripe 12 enters the InGaAsP waveguide layer 5 and is reflected distributively. Due to the excellent confinement in the transverse direction, almost all the incident light is reflected and returned to the InGaAsP active layer 3. Therefore, compared with the first embodiment shown in FIG. 2(b), the oscillation characteristics are remarkably improved. The oscillation threshold was about 30 mA at room temperature. As it is superior in current confinement and small in loss in the InGaAsP waveguide layer 5, the differential quantum efficiency is conveniently high at about 50 percent. The oscillation longitudinal mode is a single mode similar to the first embodiment and the wavelength was 1.550 microns. The driving power is reduced sufficiently to reach the practical standard. In manufacture of the single longitudinal mode semiconductor laser, the steps of mesa etching and embedded growth are added to the manufacturing process employed for the first embodiment. However, the reproducibility of the process is excellent and the yield is not necessarily lowered although it takes a longer process than the first embodiment.

Reliability is substantially the same as the first embodiment, or even higher due to the reduction achieved in driving power.

The present invention is by no means limited to the above five embodiments. For instance, the 2nd, 3rd, 4th and 5th embodiments may be modified to have an embedded structure similar to that of the 6th embodiment. Although the InGaAsP active layer 3 and the InGaAsP waveguide layer 5 are joined at the boundary of (111) plane, other planes such as (113) may also be used as the boundary. As the material for the semiconductor, other materials such as AlGaAs group formed on a GaAs substrate may be used.

In summation, the present invention is advantageous in that it enables a single longitudinal mode oscillation, it has a low oscillation threshold and a high differential quantum efficiency, the manufacture is simple and the reliability is high.

What is claimed is:

1. A double heterostructure semiconductor laser device comprising:
    a composite structure including a semiconductor substrate of one conductivity type and a first semiconductor layer disposed on said semiconductor substrate, said composite structure having a first level and a second level, said second level being higher than said first level by a distance equal to or greater than the thickness of said first semiconductor layer, the transition between said first and second levels being in the propagation direction of the laser radiation and having a slant crystal face, and said first semiconductor layer on said second level, having a periodic structure of a prescribed pitch and thickness formed in the propagation direction of the laser radiation, for providing an optical reflector;
    a second semiconductor layer of said one conductivity type, formed on said first and second levels, having a greater bandgap than that of said first semiconductor layer, said second semiconductor layer comprising two portions the first portion overlying said first level, the second portion overlying said second level;
    a semiconductor active layer, formed on said second semiconductor layer, having a smaller bandgap than that of said second semiconductor layer, the ends of said semiconductor active layer and first semiconductor layer abutting together in the extension of said slant crystal face;
    a third semiconductor layer of the opposite conductivity type to that of said substrate, formed on said semiconductor active layer and said slant crystal face, and having a greater bandgap than that of said semiconductor active layer; and
    a pair of electrodes in contact with said laser device for injecting a current into said semiconductor active layer to produce stimulated emission of radiation.

2. The double heterostructure semiconductor laser device of claim 1, further comprising:
    an elongated mesa extending in parallel to the propagation direction of laser radiation;
    first and second channels extending along both sides of said mesa, said channels being of a depth which reaches said semiconductor substrate;
    fourth and fifth semiconductor layers, opposite to each other in conductivity type, formed on a multi-layered structure except for the top surface of said mesa, for blocking a current flow therethrough; and
    a sixth semiconductor layer of the opposite conductivity type to that of said substrate covering said fifth semiconductor layer and the top surface of said mesa.

3. The double heterostructure semiconductor laser device of claim 1 further comprising: a fourth semiconductor layer formed between said first semiconductor layer and second semiconductor layer.

4. The double heterostructure semiconductor laser device of claim 1, further comprising: a fourth semiconductor layer formed between said first semiconductor layer and said substrate.

* * * * *

UNITED STATES PATENT AND TRADEMARK OFFICE
CERTIFICATE OF CORRECTION

PATENT NO. : 4,618,959
DATED : October 21, 1986
INVENTOR(S) : Ikuo MITO

It is certified that error appears in the above-identified patent and that said Letters Patent is hereby corrected as shown below:

Column 3, line 19, delete "onto" and insert --on--

Column 5, line 5, delete "in" and insert --to--

Column 5, line 4, "to" should read --in--.

Signed and Sealed this

Twenty-fourth Day of March, 1987

Attest:

DONALD J. QUIGG

*Attesting Officer*  *Commissioner of Patents and Trademarks*